United States Patent
Mouttet (10) Patent No.: US 7,576,565 B2
(45) Date of Patent: Aug. 18, 2009

(54) CROSSBAR WAVEFORM DRIVER CIRCUIT

(76) Inventor: Blaise Laurent Mouttet, 4201 Wilson Blvd. #110-364, Arlington, VA (US) 22203

(*) Notice: Subject to any disclaimer, the term of this patent is extended or adjusted under 35 U.S.C. 154(b) by 4 days.

(21) Appl. No.: 12/081,793

(22) Filed: Apr. 22, 2008

(65) Prior Publication Data

US 2008/0212382 A1    Sep. 4, 2008

Related U.S. Application Data

(63) Continuation-in-part of application No. 11/790,495, filed on Apr. 26, 2007, now Pat. No. 7,447,828.

(51) Int. Cl.
*H03K 19/177* (2006.01)
*H01L 25/00* (2006.01)

(52) U.S. Cl. .............................. 326/41; 326/39; 326/47

(58) Field of Classification Search .................. 326/38, 326/39, 41, 47; 977/708, 767
See application file for complete search history.

(56) References Cited

U.S. PATENT DOCUMENTS

| | | | |
|---|---|---|---|
| 4,597,162 A | 7/1986 | Johnson et al. | |
| 4,646,266 A | 2/1987 | Ovshinsky et al. | |
| 5,223,750 A | 6/1993 | Nichogi et al. | |
| 5,272,359 A | 12/1993 | Nagasubramanian et al. | |
| 5,912,839 A | 6/1999 | Ovshinsky et al. | |
| 6,128,214 A | 10/2000 | Kuekes et al. | |
| 6,198,655 B1 | 3/2001 | Heath et al. | |
| 6,248,674 B1 | 6/2001 | Kamins et al. | |
| 6,256,767 B1 * | 7/2001 | Kuekes et al. | 716/9 |
| 6,314,019 B1 | 11/2001 | Kuekes et al. | |
| 6,432,740 B1 | 8/2002 | Chen | |
| 6,518,156 B1 | 2/2003 | Chen et al. | |
| 6,531,371 B2 | 3/2003 | Hsu et al. | |
| 6,574,130 B2 | 6/2003 | Segal et al. | |
| 6,586,965 B2 | 7/2003 | Kuekes et al. | |
| 6,693,821 B2 | 2/2004 | Hsu et al. | |
| 6,746,971 B1 | 6/2004 | Ngo et al. | |
| 6,812,117 B1 | 11/2004 | Tringe | |
| 6,835,575 B2 | 12/2004 | Chen | |
| 6,846,682 B2 | 1/2005 | Heath et al. | |
| 6,854,092 B2 | 2/2005 | Hogg | |
| 6,867,996 B2 | 3/2005 | Campbell et al. | |
| 6,870,394 B2 | 3/2005 | Kuekes | |
| 6,880,146 B2 | 4/2005 | Snider | |

(Continued)

OTHER PUBLICATIONS

Ziegler et al., A Case for CMOS/Nano Co-design, ACM-SIGDA Emerging Technologies Seminar, Nov. 2002, 5 pgs.

(Continued)

*Primary Examiner*—Daniel D Chang (57) ABSTRACT

A driving waveform circuit includes a crossbar array having input columns and output rows wherein the crossbar array is configured to store data in the form of high or low resistance states, delay timing circuitry electrically connecting an input signal to the input columns of the crossbar array and configured to provide a relative delay timing between the input signal and each input column, and summation circuitry electrically connected to the output rows of the crossbar array for generating one or more output signals based on the stored resistance state data and the input signal. The driving waveform circuit is taught to be applied as inkjet printing drivers, micromirror drivers, robotic actuators, display device drivers, audio device drivers, computational device drivers, and counters.

20 Claims, 7 Drawing Sheets

U.S. PATENT DOCUMENTS

| | | | |
|---|---|---|---|
| 6,898,098 B2 | 5/2005 | Snider et al. | |
| 6,900,479 B2 | 5/2005 | DeHon et al. | |
| 6,919,740 B2 | 7/2005 | Snider | |
| 6,960,783 B2 | 11/2005 | Lan et al. | |
| 6,963,077 B2 | 11/2005 | DeHon et al. | |
| 6,995,649 B2 | 2/2006 | Nugent | |
| 6,998,333 B2 | 2/2006 | Chen et al. | |
| 7,183,141 B1 | 2/2007 | Bulovic et al. | |
| 7,203,789 B2 | 4/2007 | Snider | |
| 7,274,208 B2 * | 9/2007 | DeHon et al. | 326/38 |
| 7,310,004 B2 * | 12/2007 | DeHon | 326/41 |
| 7,358,524 B2 | 4/2008 | Lee et al. | |
| 7,359,888 B2 | 4/2008 | Snider | |
| 2007/0200158 A1 | 8/2007 | Genrikh et al. | |
| 2008/0090337 A1 | 4/2008 | Williams | |

OTHER PUBLICATIONS

Lee et al., CMOL Crossnets as Pattern Classifiers, IWANN, 2005, pp. 446-454, Springer-Verlag Berlin Heidelberg.

Das et al., Architectures and Simulations for Nanoprocessor Systems Integrated on the Molecular Scale, Introducing Molecular Electronics, 2006, chap. 17, pp. 1-34.

Koch, Morphware, Scientific American, Aug. 2005, vol. 293, No. 2, pp. 56-63, Scientific American Inc.

* cited by examiner

Fig.15

CROSSBAR WAVEFORM DRIVER CIRCUIT

This patent application is a Continuation-In-Part of U.S. patent application Ser. No. 11/790,495, filed Apr. 26, 2007, which is a Continuation of U.S. Pat. No. 7,302,513, filed Apr. 3, 2006.

FIELD OF THE INVENTION

The present invention pertains to a waveform driving circuit using a crossbar switching architecture. Applications of the driving circuit are taught for robotic actuators, inkjet drivers, digital displays drivers, audio device drivers, computational device drivers, and counters.

BACKGROUND OF THE INVENTION

As disclosed in parent U.S. Pat. No. 7,302,513, which is incorporated by reference in its entirety, crossbar circuit architectures may be configured to provide for programmable signal processors. The present patent application provides further embodiments of such systems to provide waveform driving circuitry.

DETAILED DESCRIPTION

Figure 1:
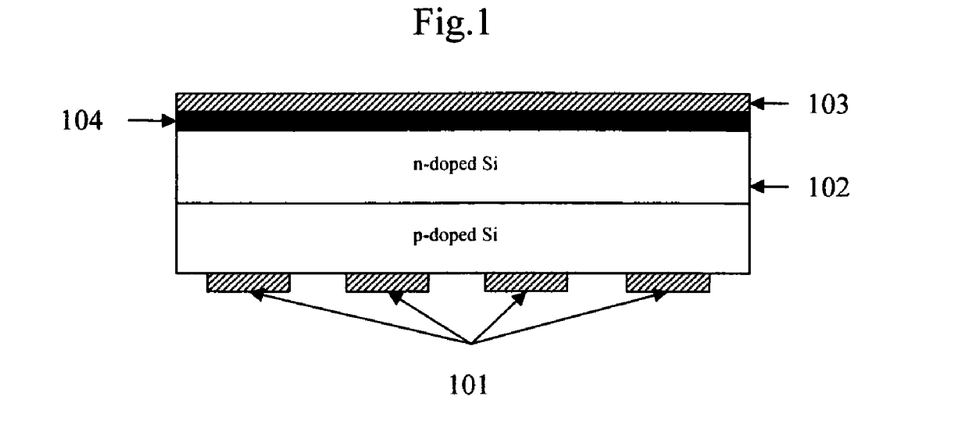
FIG. 1 illustrates a cross-section of one example of a crossbar circuit element.

FIG. 1 illustrates a cross-section of one example of a crossbar circuit element as described in U.S. Pat. No. 7,302,513. The basic function of the crossbar structure is to provide programmable diode switches in which each intersection of the crossbar array is switchable between a high resistance state and a low resistance state. The basic configuration of FIG. 1 illustrates a pn-junction rectification layer 102 formed of a silicon wafer doped with p-type material on one side and n-type material on the opposite side. A set of parallel input wires 101 is patterned on the p-doped side of the wafer. The input wiring 101 may be formed of metallic wiring or highly p-doped polysilicon so as to provide an array of electrically conductive wires directed into the plane as illustrated in FIG. 1. Similarly, output wiring array 103 is patterned on the n-doped side of the wafer. The output wiring array 103 may be formed of metallic wiring or highly n-doped polysilicon so as to provide an array of electrically conductive wires directed orthogonally to wiring array 101. Material layer 104 is a resistance switching material layer such as a rotaxane molecular film, a chalcogenide material, a perovskite material, TCNQ material or any equivalent resistance switching material which are generally employed in a variety of non-volatile resistive RAM designs such as Nagasubramanian et al. U.S. Pat. No. 5,272,359, Kuekes et al. U.S. Pat. No. 6,128,214, Hsu et al. U.S. Pat. No. 6,531,371, and Campbell U.S. Pat. No. 6,867,996, each or which is incorporated by reference in their entirety. It is noted that the crossbar structure of FIG. 1 is only one of many possible implementations of the crossbar structure usable in the current invention and other designs are conceivable such as via the use of Schottky diode junctions instead of pn-junctions or a nanowire crossbar construction such as taught by Kuekes et al. U.S. Pat. No. 6,128,214. In addition, modifications of the structure may be made to improve performance such as etching the regions of the p-doped side of the wafer between the wiring 101 and etching the regions of the n-doped wiring between the wiring array 103 in order to prevent crosstalk between different wiring portions. As an alternative modification the doping concentration between the wiring or spacing between the wiring may be adjusted so as to increase resistance and reduce crosstalk between adjacent wires in wire arrays 101 and 103. Also, if material 104 has intrinsic rectification properties, rectification layer 102 may be excluded altogether. Yet another route to programmable diode crossbar structures may be obtained using nanowire interconnects in an electrolytic medium as described by Lee et al. U.S. Pat. No. 7,358,524 so that pn-junction nanowires may form the material 104 between anode wires and cathode wires forming the crossbar.

Figure 2:
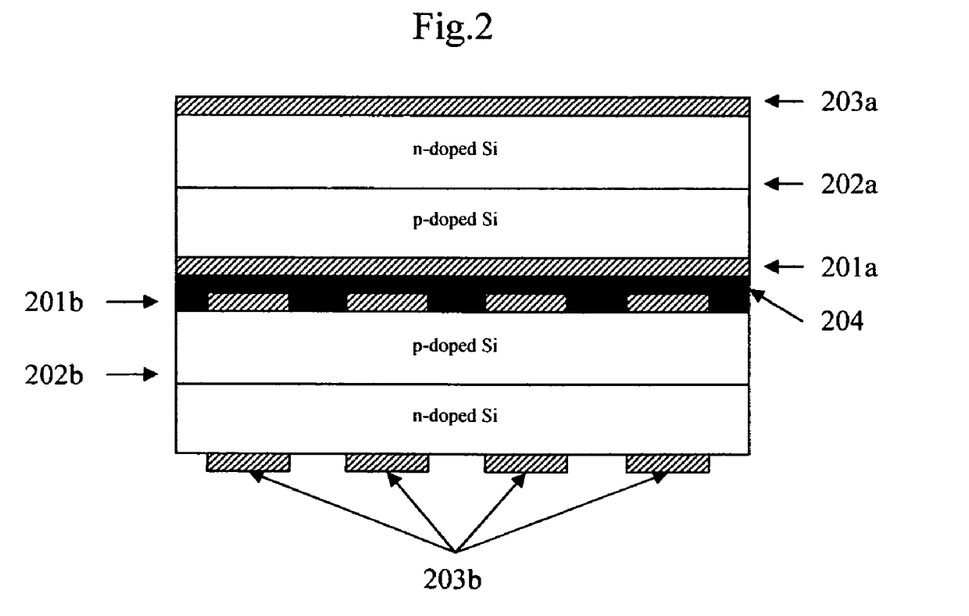
FIG. 2 illustrates a cross-section of one example of a reprogrammable crossbar circuit element using conductive wiring layers.

FIG. 2 illustrates a cross-section of one example of a reprogrammable crossbar circuit element using conductive wiring layers as described in U.S. Pat. No. 7,302,513. This design allows for reconfiguration of the resistance state of the material layer 204 by a dual crossbar structure formed of first input wiring array 201a, first rectification layer 202a, first output wiring array 203a in a first crossbar section and second input wiring array 201b, second rectification layer 202b, and second output wiring array 203b in a second crossbar section with resistance programmable material 204 formed between the two crossbar sections. Depending on the material used for 204 programming of the resistance switching material from a high to low resistance state at a particular intersection of the crossbar may be performed by applying a voltage higher than a threshold value between a selected input wire of array 201b and an output wire of array 203a while reversal of a programmed low resistance state may be performed by applying a voltage higher than a threshold voltage between a selected input wire of array 201a and an output wire of array 203b. Material 204 should preferably be chosen to include some rectification properties to avoid electrical feedback paths within the crossbar formed by wiring 201a and 201b although this may not be necessary depending on the application. The input wiring layers 201a and 201b may also be formed of highly p-doped polysilicon to assist in avoiding the creation of electrical feedback paths.

Figure 3:
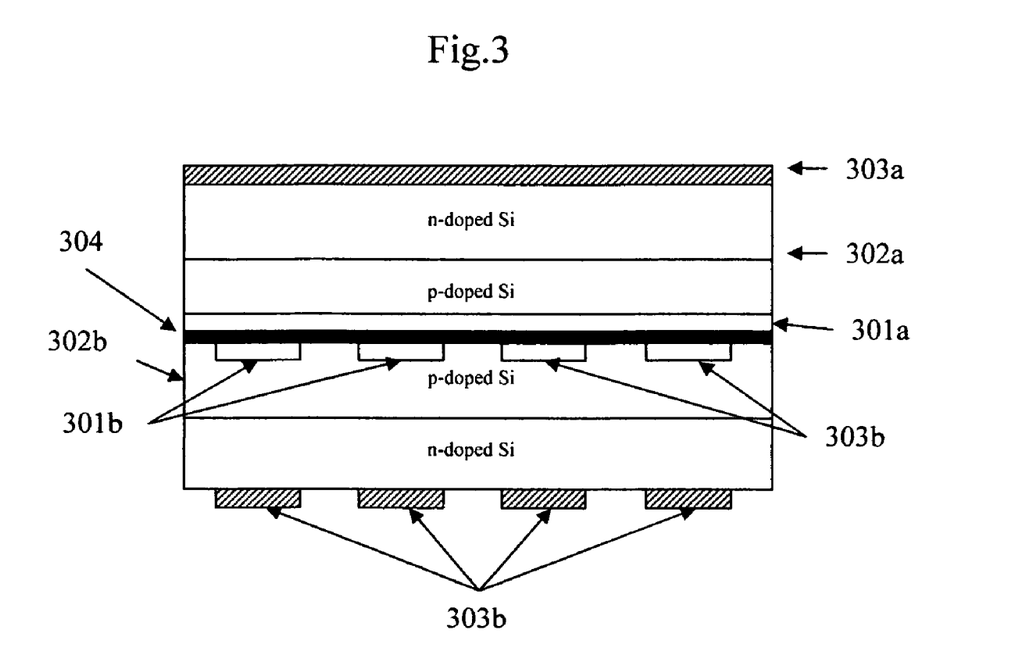
FIG. 3 illustrates a cross-section of one example of a reprogrammable crossbar circuit element using doped semiconductor wire layers.

FIG. 3 illustrates a cross-section of another example of a reprogrammable crossbar circuit element using doped semiconductor wire layers formed using bulk processing instead of surface processing of a silicon wafer. A dual crossbar structure is formed of first input wiring array 301a of highly p-doped parallel lines, first rectification layer 302a, first output metallic wiring array 303a in a first crossbar section and second input wiring array 301b of highly p-doped parallel lines, second rectification layer 302b, and second output metallic wiring array 303b in a second crossbar section with resistance programmable material 304 formed between the two crossbar sections.

Additional teachings regarding programming crossbar architectures as well as related resistance switching devices are found in the parent U.S. Pat. No. 7,302,513 as well as prior art such as Rinerson et al. U.S. Pat. No. 6,940,744 and Ovshinsky et al. U.S. Pat. No. 5,912,839.

Figure 4:
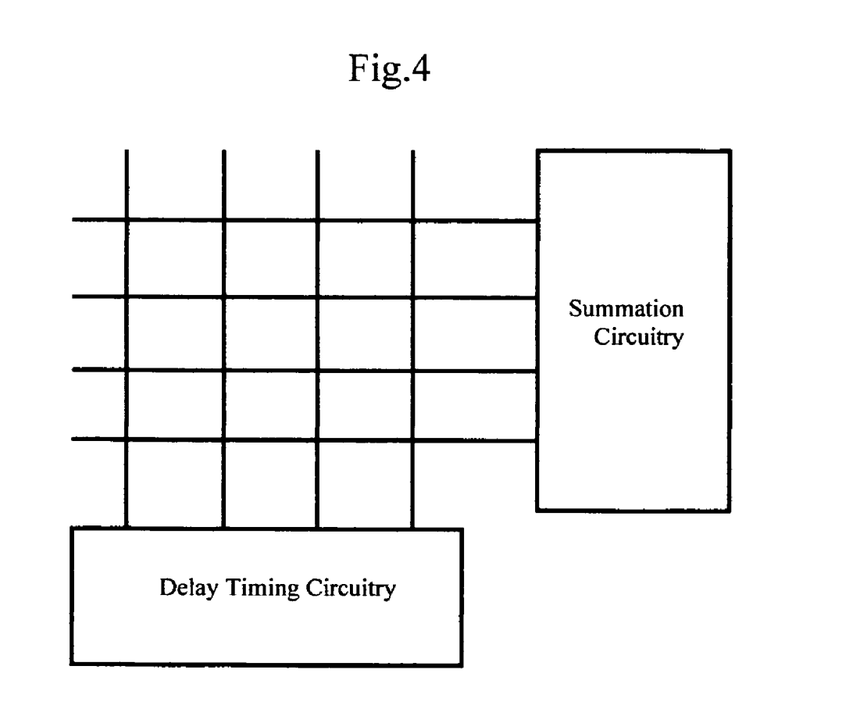
FIG. 4 illustrates a crossbar driving waveform circuit in accordance with the present invention.

FIG. 4 illustrates a crossbar driving waveform circuit in accordance with the present invention including delay timing circuitry electrically connected to columns of a resistance switching crossbar array having rows connected to summation circuitry. The delay timing circuitry may be implemented in hardware or from software as part of a general purpose microprocessor to produce drive signal pulses input with relative delay offsets to columns of the crossbar array.

Figure 5:
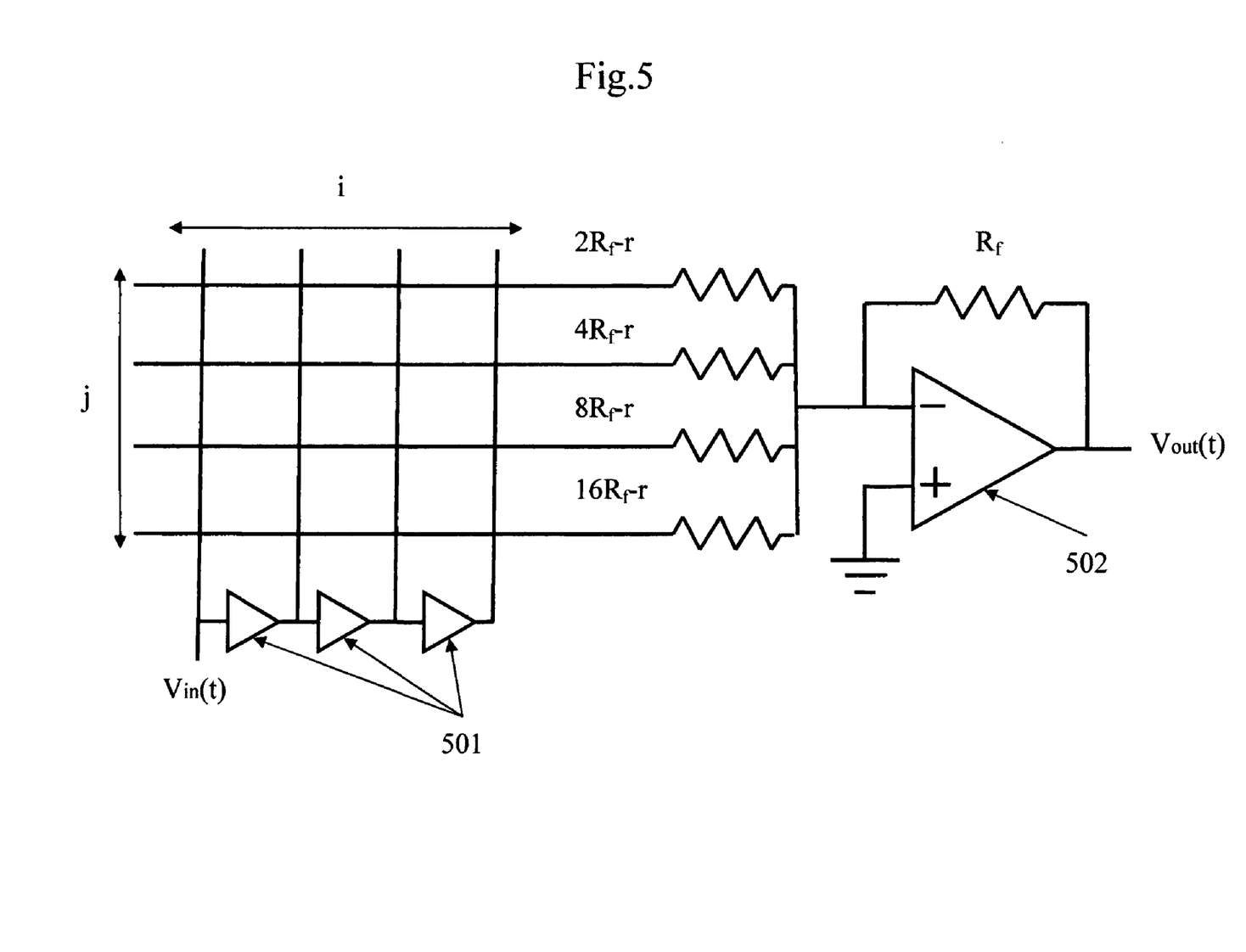
FIG. 5 illustrates one example of the crossbar driving waveform circuit configured for both amplitude and timing adjustments for a single output drive signal.

FIG. 5 illustrates one particular example of a crossbar driving waveform circuit configured for both amplitude and timing adjustments for a single output drive signal $V_{in}(t)$. The rows j of a resistance switch crossbar array are connected to the inverting terminal of an operational amplifier 502 via an array of weighting resistors and the columns i of the crossbar array are connected to input signal $V_{in}(t)$ via fixed delay elements 501. Connecting a feedback resistance $R_f$ between the output of the operational amplifier 502 and the inverting terminal establishes negative feedback leading to the inverting terminal being driven to the same potential as the non-inverting terminal. Based on conservation of current the sum of the currents at the inverting terminal should be zero leading to Eq. 1 below:

$$\frac{V_{out}(t)}{R_f} = -\sum_j I(j) \qquad (\text{Eq. 1})$$

where I(j) are the currents coming in from the crossbar rows and $V_{out}(t)$ is the output signal. The currents from each of the crossbar rows may be derived based on the superposition of currents from each intersection of the crossbar array. For each intersection of the crossbar the equivalent voltage is calculated based on the ratio of the Thevenin equivalent voltage divided by the Thevenin equivalent resistance. The equivalent voltage is the input voltage to the crossbar column V(i) reduced by the voltage loss due to rectification effects inherent to the crossbar array structure. The equivalent resistance is calculated based on the sum of the resistance of the resistance switching material at each crossbar intersection r(i,j) and the weighting resistance for the row given by R(j). The resultant currents from the crossbar rows are thus computed as:

$$I(j) = \sum_i \frac{V(i) - V_{rect}}{r(i,j) + R(j)} \qquad (\text{Eq. 2})$$

By providing a periodic rectangular pulse having a period T as the input signal $V_{in}(t)$ and forming the delay elements each with a fixed delay equal to T/N, where N is the number of columns of the crossbar, the input voltage to the $i^{th}$ column may be expressed as:

$$V(i) = V_{in}(t - (i-1)T/N) \qquad (\text{Eq.3})$$

As illustrated in FIG. 5, the weighting resistances of the crossbar rows are tuned to the following values:

$$R(j) = 2^j R_f - r \qquad (\text{Eq.4})$$

where $R_f$ is the value of the feedback resistance of the op-amp and r is the average low resistance state of the resistance switching material of the crossbar array. Combining (Eq. 1)-(Eq. 4) the overall output signal is:

$$V_{out}(t) = -\sum_{ij} \frac{V_{in}(t - (i-1)T/N) - V_{rect}}{2^j + (r(i,j) - r)/R_f} \qquad (\text{Eq. 5})$$

Thus for intersections of the crossbar array programmed with low resistance states r(i,j)=r, the denominator of (Eq. 5) reduces to $2^j$. For intersections of the crossbar array programmed with high resistance states r(i,j)>>$R_f$, the denominator of Eq. 5 reduces to zero.

Figure 6:
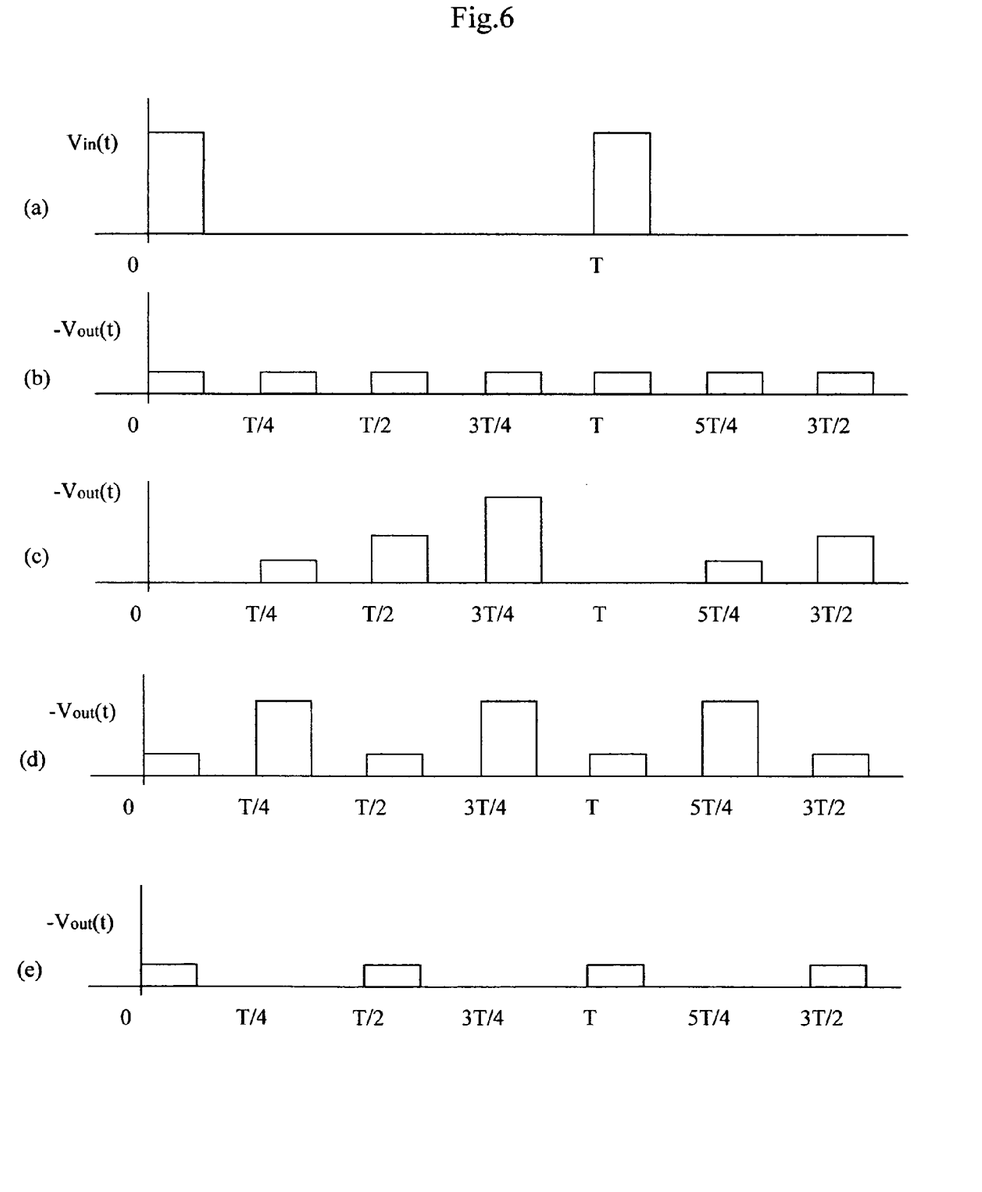
FIG. 6 illustrates examples of output driving signals for different programmed states of the crossbar in the circuit of FIG. 5 provided with a periodic input signal.

FIG. 6 illustrates some examples of output driving signals for different programmed states of the crossbar in the circuit of FIG. 5 provided with a periodic input signal (a) having a period T and a pulse width of T/8. In example (b) a single row of crossbar resistances is programmed with a low resistance state to produces a constant amplitude output signal. In example (c) each column of the crossbar is set to a different state producing increasing amplitudes for the pulses. In example (d) the first and third columns are programmed with the same first resistance states and the second and fourth columns are programmed with the same second resistance states. In example (e) the first and third columns are programmed with the same resistance states and the second and fourth columns are programmed to have all high resistance states. It is noted that while the output voltages from the op-amp have an inverted polarity, an inverting voltage follower circuit may be provided to provide a positive polarity drive voltage waveform.

In the above described configuration by selectively setting the resistances of the crossbar array both the amplitude and the pulse position of a waveform may be programmed. Using binary values of 0 and 1 to represent high and low resistance states of the crossbar a 4×4 matrix containing binary values may be used to represent an arbitrary programmed state of the waveform generator. The total number of different producible waveforms based on this circuit is thus $2^{16}$=65,536 waveforms. In the more general case $2^{N \times M}$ waveform states are achievable where N is the number of crossbar columns and M is the number of crossbar rows and the number of possible producible waveforms thus increases exponentially with the crossbar size. Predetermined waveform patterns may be stored in a memory in the form of binary matrices and used to program the resistance states of the crossbar in accordance with different modes of operation in a particular application. The binary matrices may also be altered in accordance with variation in environmental or usage conditions. For example, variations in temperature may change load parameters for a particular driven circuit element which may be compensated by a change in voltage amplitude for a particular drive waveform. Aging or frequency of use may similarly alter load parameters of a voltage driven element requiring adjustment of the drive waveform. The provision of environmental sensors may provide feedback to properly select appropriate binary matrices based on comparison of the sensed condition to predetermined thresholds. Using principles from genetic algorithms or other adaptive or evolutionary programming techniques the binary matrices of the crossbar may also be evolved over time to achieve a predetermined objective.

Figure 7:
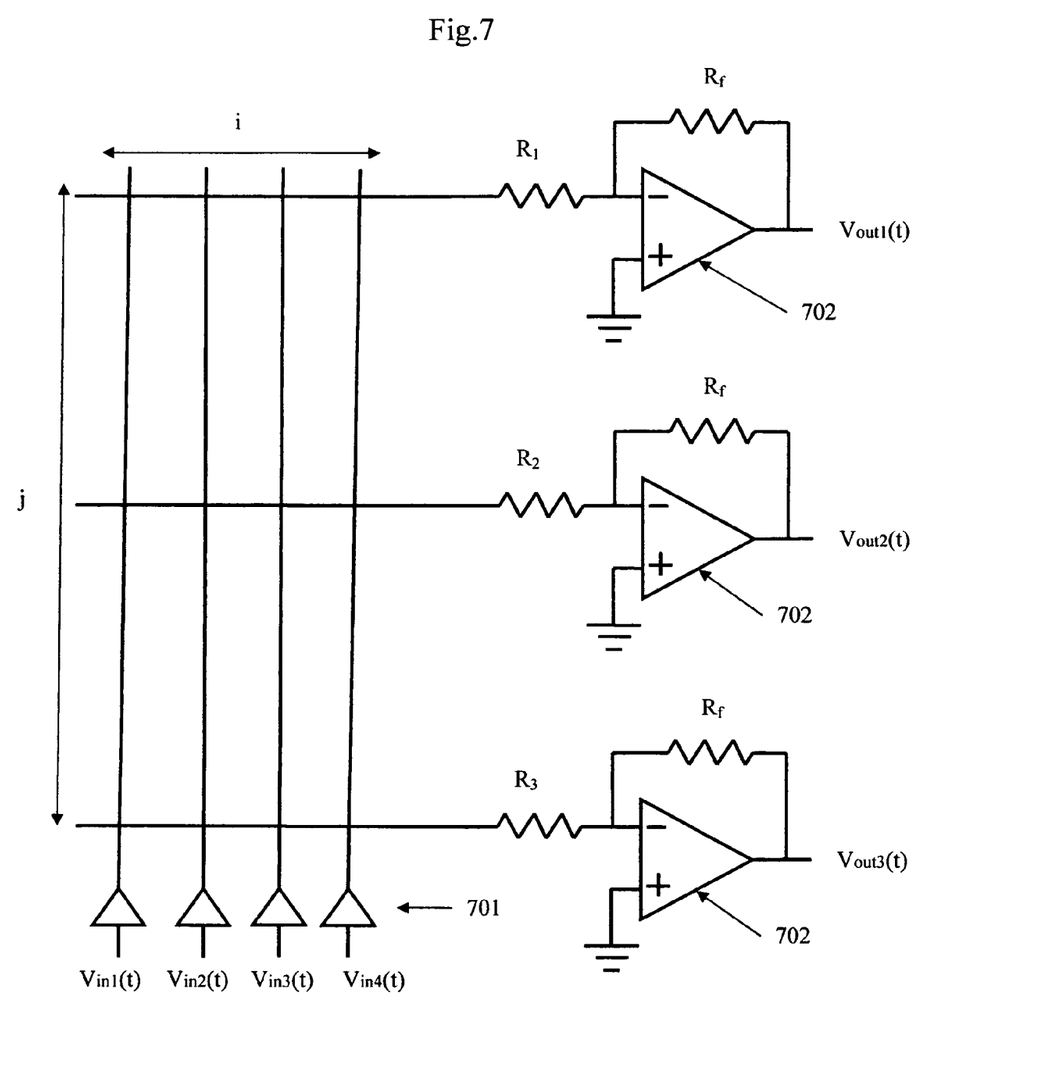
FIG. 7 illustrates one example of the crossbar driving waveform circuit having multiple output drive signals.

FIG. 7 illustrates another example of a resistance switching crossbar driving waveform circuit having multiple output drive signals instead of a single output drive signal. In this example, delay circuit elements 701 are provided separately for independent input signals $V_{in1}(t)$, $V_{in2}(t)$, $V_{in3}(t)$, and $V_{in4}(t)$ of the crossbar columns while different op-amps 702 are provided for different rows of the crossbar to produce independent output signals $V_{out1}(t)$, $V_{out2}(t)$, and $V_{out3}(t)$. In this case weighting resistances $R_1$, $R_2$, $R_3$ determine the voltage amplitudes of the output signals from each row. In the circuit of FIG. 7 the relative timing of drive pulses provided to different driven elements may be changed by altering the binary matrices. For example, a single low resistance state may be provided for each row and the position of the low resistance state within the row may be switched to achieve alignment, ordering, or coordination between the effects of the driven elements.

Figure 8:
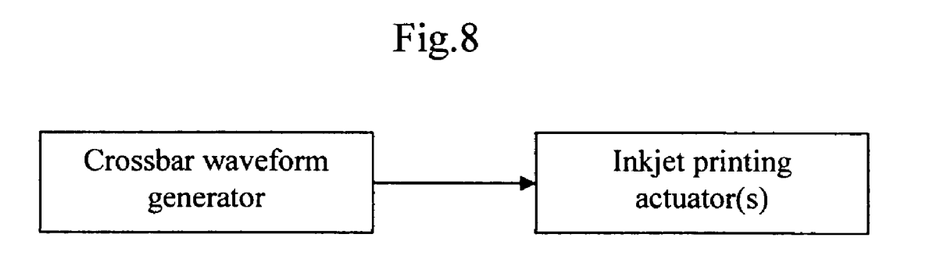
FIG. 8 illustrates one possible application of the crossbar waveform driving circuit in an inkjet printing device.

FIG. 8 illustrates one possible application of the crossbar waveform driving circuit of the present invention in an inkjet printing device. It is generally known in the art of inkjet printing to apply pulse voltages to an actuator element to eject ink. For example, thin film resistors are used to eject ink in bubble jet thermal inkjet devices while piezoelectric actuators are used to eject ink in piezoelectric inkjet printers. Dependent on the type of ink and size of ink drops being ejected the drive waveforms of the actuator elements may need to be adjusted. In addition timing adjustments of the drive waveforms for multiple actuator elements can provide drop alignment correction and compensation for ejector failure. Alteration of the crossbar resistances of the crossbar waveform generator can provide such adjustments.

Figure 9:
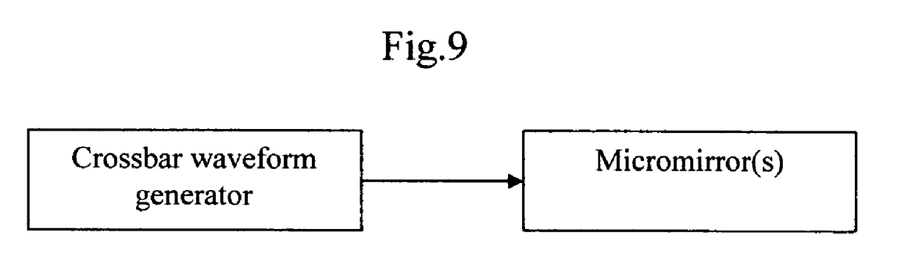
FIG. 9 illustrates one possible application of the crossbar waveform driving circuit as a micromirror driver.

FIG. 9 illustrates one possible application of the crossbar waveform driving circuit as a micromirror driver. It is generally known to use one or more micromirrors as optical switching devices for projector and display applications. These micromirrors are often controlled by electrostatic actuators which may be driven by the crossbar waveform generator of the present invention in which alteration of the crossbar resistances of the crossbar waveform generator can control the timing of actuation of one or more micromirrors to change the path of light for such applications.

Figure 10:
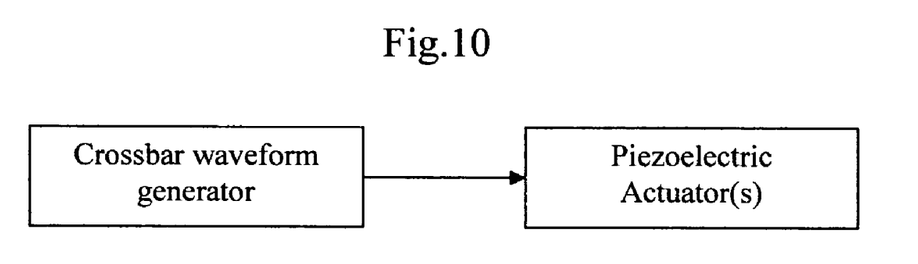
FIG. 10 illustrates one possible application of the crossbar waveform driving circuit as a piezoelectric actuator driver.

FIG. 10 illustrates one possible application of the crossbar waveform driving circuit as a piezoelectric actuator driver. This may be implemented in a micro-robotic system or a micro-positioning system in which optical sensor feedback is used to determine an appropriate binary matrix for a crossbar driving circuit used to control the piezoelectric actuator.

Figure 11:
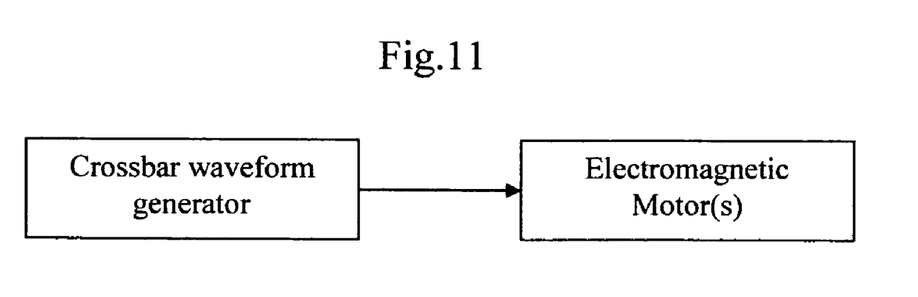
FIG. 11 illustrates one possible application of the crossbar waveform driving circuit in an electromagnetic motor driver.

FIG. 11 illustrates one possible application of the crossbar waveform driving circuit in an electromagnetic motor driver. Alterations of the binary matrix of the crossbar resistance states may be used to change the frequency of drive pulses for an ac motor or the voltage amplitude of a drive pulse for a dc motor. This may be implemented in a robotic system in which optical sensor feedback is used to determine an appropriate binary matrix for a crossbar driving circuit driving one or more motors that control the movement of joints of a robot.

Figure 12:
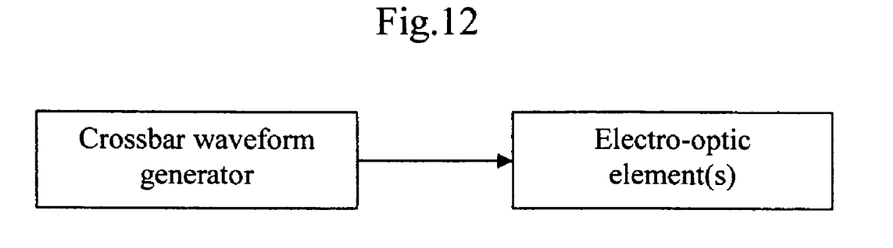
FIG. 12 illustrates one possible application of the crossbar waveform driving circuit in an electro-optic device driver.

FIG. 12 illustrates one possible application of the crossbar waveform driving circuit in an electro-optic device driver. The electro-optic elements may take the form of one or more LED elements, LCD elements, or electrophoretic cells used as indicators or as components of electronic displays or electronic paper. Alteration of the binary matrix of the crossbar resistance states may change an ordering of actuation of such electro-optic elements used in a variable display application.

Figure 13:
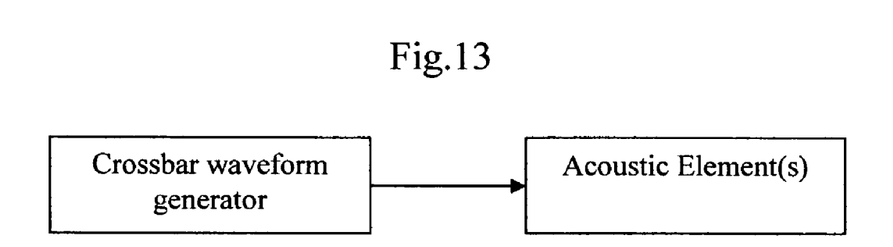
FIG. 13 illustrates one possible application of the crossbar waveform driving circuit in an acoustic device driver.

FIG. 13 illustrates one possible application of the crossbar waveform driving circuit in an acoustic device driver. In this case the crossbar resistance states may be programmed to be representative of music or sounds with the waveform produced by the crossbar waveform driving circuit driving one or more acoustic transducers to produce the music or sounds.

Figure 14:
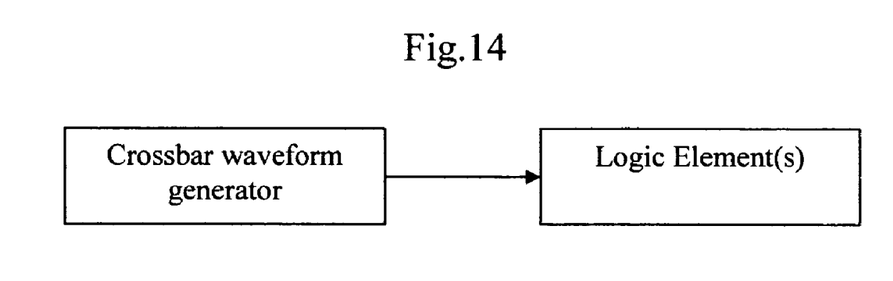
FIG. 14 illustrates one possible application of the crossbar waveform driving circuit in a logic device driver.

FIG. 14 illustrates one possible application of the crossbar waveform driving circuit in a logic device driver. For example, in a computing device the pulses of one or more waveforms produced by the crossbar waveform driving circuit may be representative of timing signals used to carry out a series of computational operations. Alteration of the crossbar resistance states may provide for reconfigurable computing.

Figure 15:
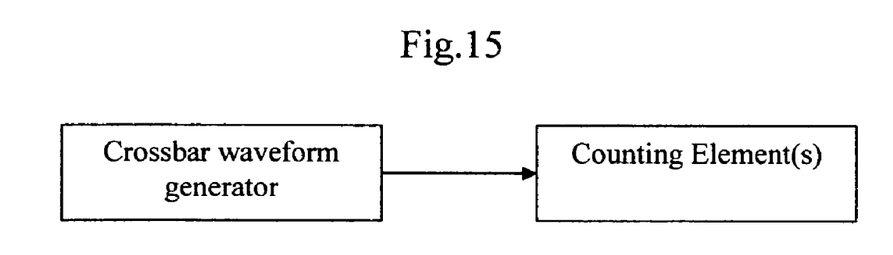
FIG. 15 illustrates one possible application of the crossbar waveform driving circuit in a counting device.

FIG. 15 illustrates one possible application of the crossbar waveform driving circuit in a counting device. For example, using relative timing delays of various orders of magnitude (e.g. 1 microsecond, 1 millisecond, 1 second, 1 minute, 1 hour, etc.) for the delay timing circuitry, a programmable timer may be formed from the crossbar waveform driving circuit forming the basis of a clocking circuit used in synchronous or asynchronous counters.

As described above the crossbar driving waveform circuit may be applied in a variety of applications and a variety of modifications may be made to the systems as described above. For example, the delay values between the signals input to the columns of the crossbar array may be programmable to provide further adjustment of the output waveform and different pulse widths, amplitudes, and frequencies may be used for the input signals. Depending on the application the input pulses may be periodic or non-periodic waveforms. While FIG. 6 illustrates an example in which the waveforms output from the crossbar array are non-overlapping, overlapping waveform outputs are also be produced such as illustrated in U.S. Pat. No. 7,302,513 (FIGS. 10a and 10b). In order to expand the range of waveforms that may be generated by the crossbar driving waveform circuit integrator circuitry may be provided at the output to provide sloped or triangular waveforms. Comparison or filtering circuitry may also be provided at the output to remove dc voltage offsets or noise. While exemplary sizes of the crossbar are shown as 4×4 and 4×3 in FIGS. 5 and 7 a number of different crossbar sizes may also be implemented such as 2×2, 2×3, 3×2, . . . , 10×10, etc. For nanowire crossbar arrays the wires may have a width less than 100 nm formed by a nanoimprint lithography or self-assembly process. This offers the benefit of a high density crossbar but at the cost of higher resistance levels due to lower cross-sectional area for the crossbar states at each wire intersection and a larger possibility of defects in the nanowires. Larger widths (>100 nm) may be formed for the crossbar wiring using optical lithography methods or other processes common to semiconductor fabrication to produce lower relative resistance levels due to the higher cross-sectional area at each crossbar intersection.

In the various embodiments described herein adaptive programming of the binary matrix resistance states of the crossbar may be performed in accordance with a software routine to optimize the functioning of the waveform produced. For example, in the embodiment of FIG. 5 small adjustments of the amplitude of the output voltage relative to the input voltage amplitude may be achieved by switching the states of the lowest row having a weighting resistance of $16R_f$-r from high resistance to low resistance states. Larger adjustments of the amplitude may be achieved by altering the rows having lower values of weighting resistors. Sequential alteration of the resistance states of the lower rows to the upper rows may be used as part of a hill climbing algorithm in which an attribute of a driven element to which the output drive waveform is applied is compared or tested against some predetermined criteria. The resistance states are maintained in the modified resistance state if an improvement in the output waveform relative to the predetermined criteria is found. However, if the modified resistance state is detrimental to the tested attribute the resistance may be switched back to the original state. The resistance states may be switched and tested one column at a time, one row at a time, or by individual crosspoint intersections of the crossbar array until a best possible drive waveform for achieving a desired result from the driven element is identified.

Genetic algorithms are another software methodology which may be used to optimize the waveform. In this software method large population of potential binary matrix resistance states may be initially established. In general $2^{N \times M}$ possible members of the population are possible for a crossbar with N columns and M rows programmed with binary resistance states. For example, a 10×10 crossbar will have approximately $10^{30}$ possible drive waveform states. A selection of a portion of these states may represent a first generation of binary matrix resistance states programmed into the crossbar array. Comparing one or more outputs of driven elements based on the first generation to predetermined criteria, a subset of the first generation producing the best results may be selected. This subset may be recombined to create a second generation of binary matrix resistance states by mixing the highest performing row states with other high performing row states or mixing the highest performing column states with other high performing column states. This process may be repeated to create further generations in accordance with known methods of genetic algorithms optionally including other steps such as random mutation that adds states not within the current generation to provide variability in the optimization.

It is noted that hill climbing and genetic algorithm optimization techniques described above may be particularly useful in robotic and artificial intelligence applications. For example, the predetermined criteria being tested may be the movement of a robotic system detected by an optical imaging sensor such as a CCD, CMOS, or crosswire sensor array. The robotic system may include various motors in which coordination of sequential actuation is required to perform functions such as picking up an object or moving robotic wheels or legs over a non-uniform surface. Using an optimizing algorithm and feedback based on the optical imaging sensor the resistance states of the crossbar may be reprogrammed so that the robotic system can learn to perform various different desired functions or movements in accordance with different sensed images. Over time a mapping between various sensed images and the optimized crossbar binary resistance states representative of the robotic movement or action may be developed and stored in a look-up table memory. These mappings may be shared between multiple robotic systems having the same or similar configuration using wireless, fiber optic, or cable communication so as to share learning between the robotic systems.

Alteration of the resistance states of a crossbar control circuits as described above may also be initiated by a change in an environmental condition, such as by detecting temperature, motion, sound, a change in weight, or detection of one or more chemicals. This is useful to optimize the waveform driving circuits to particular environmental conditions. For example, under different temperature ranges resistance values of a driven load may alter which can affect the desired performance of the waveform driving circuit. The crossbar resistances may be adjusted to compensate for such temperature induced changes. In other cases, a detection of motion, sound, or certain chemical compositions may require a certain signal processing task to be achieved in applications involving robotics, security systems, or safety systems. Binary matrix values stored in a look-up table of a memory device may be programmed into crossbar waveform driving circuits according to different sensed ranges of temperature, sound, motion, or chemicals. Of course, in addition to automatic reprogramming of the resistance states of the crossbar, manual reprogramming via a user interface may be performed.

As described above many modifications of the present invention are possible and many applications are possible. The present invention is only limited by the following claims.

I claim:

1. A driving waveform circuit including
    a crossbar array having input columns and output rows wherein the crossbar array is configured to store data in the form of high or low resistance states;
    delay timing circuitry electrically connected to the input columns of the crossbar array and configured to provide a relative delay timing between input signals of each input column; and
    summation circuitry electrically connected to the output rows of the crossbar array for generating one or more output signals based on the stored resistance state data and the input signals.

2. The driving waveform circuit of claim 1, wherein the crossbar includes wires having diameters less than 100 nm.

3. The driving waveform circuit of claim 1, wherein the crossbar includes wires having diameters greater than 100 nm.

4. The driving waveform circuit of claim 1, wherein the crossbar array includes TCNQ material as resistance variable material.

5. The driving waveform circuit of claim 1, wherein the crossbar array includes chalcogenide material as resistance variable material.

6. The driving waveform circuit of claim 1, wherein the crossbar array includes perovskite material as resistance variable material.

7. The driving waveform circuit of claim 1, wherein the crossbar array includes rotaxane material as resistance variable material.

8. The driving waveform circuit of claim 1, wherein the summation circuitry includes an operational amplifier.

9. The driving waveform circuit of claim 8, wherein each of the crossbar rows are electrically connected to a common inverting terminal of the operational amplifier via resistors having different values.

10. The driving waveform circuit of claim 1, wherein the summation circuitry includes multiple operational amplifiers electrically connected to different rows of the crossbar array.

11. The driving waveform circuit of claim 1, wherein the input signals are periodic signals with period T and the relative delay timing is less than T.

12. The driving waveform circuit of claim 1, wherein the input signals are periodic signals with period T and the relative delay timing is greater than T.

13. An inkjet printing device including the driving waveform circuit of claim 1 and at least one inkjet actuator driven by the driving waveform circuit.

14. A device including the driving waveform circuit of claim 1 and at least one micromirror driven by the driving waveform circuit.

15. A device including the driving waveform circuit of claim 1 and at least one piezoelectric actuator driven by the driving waveform circuit.

16. A device including the driving waveform circuit of claim 1 and at least one electromagnetic motor driven by the driving waveform circuit.

17. A display device including the driving waveform circuit of claim 1 and at least one electro-optic element driven by the driving waveform circuit.

18. An audio device including the driving waveform circuit of claim 1 and at least one acoustic element driven by the driving waveform circuit.

19. A computing device including the driving waveform circuit of claim 1 and at least one logic element driven by the driving waveform circuit.

20. A counting device including the driving waveform circuit of claim 1 and at least one counter driven by the driving waveform circuit.

* * * * *